United States Patent
Xie et al.

(10) Patent No.: US 11,864,379 B2
(45) Date of Patent: Jan. 2, 2024

(54) THREE-DIMENSIONAL MEMORY AND CONTROL METHOD THEREOF

(71) Applicant: YANGTZE MEMORY TECHNOLOGIES CO., LTD., Wuhan (CN)

(72) Inventors: Xuezhun Xie, Wuhan (CN); Yali Song, Wuhan (CN); Lei Jin, Wuhan (CN); Xiangnan Zhao, Wuhan (CN); Yuanyuan Min, Wuhan (CN); Jianquan Jia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 171 days.

(21) Appl. No.: 17/568,639

(22) Filed: Jan. 4, 2022

(65) Prior Publication Data

US 2022/0165741 A1  May 26, 2022

Related U.S. Application Data

(63) Continuation of application No. PCT/CN2021/122551, filed on Oct. 8, 2021.

(30) Foreign Application Priority Data

Nov. 26, 2020  (CN) .......................... 202011345682.1

(51) Int. Cl.
*G11C 11/34* (2006.01)
*H10B 41/27* (2023.01)
(Continued)

(52) U.S. Cl.
CPC .............. *H10B 41/27* (2023.02); *G11C 5/025* (2013.01); *G11C 16/0483* (2013.01); *G11C 16/3436* (2013.01); *H10B 43/27* (2023.02)

(58) Field of Classification Search
CPC .. G11C 5/025; G11C 16/0483; G11C 16/3436
(Continued)

(56) References Cited

U.S. PATENT DOCUMENTS 10,636,500 B1  4/2020  Chen et al.
2009/0073763 A1  3/2009  Hosono
(Continued)

FOREIGN PATENT DOCUMENTS

CN  101315813 A  12/2008
CN  108074603 A  5/2018
(Continued)

OTHER PUBLICATIONS

International Search Report issued in corresponding International Application No. PCT/CN2021/122551 dated Jan. 12, 2022, 5 pages.

*Primary Examiner* — Vu A Le
(74) *Attorney, Agent, or Firm* — BAYES PLLC

(57) ABSTRACT

The present disclosure relates to a three-dimensional memory (3D) and a control method thereof. The 3D memory includes a first deck and a second deck which are stacked in a vertical direction of a substrate. The first deck and the second deck each includes a plurality of memory string. Each memory string includes a plurality of memory cells. The plurality of memory cells includes a first portion and a second portion. A diameter of channel structure corresponding to the first portion of memory cells is smaller than that of channel structure corresponding to the second portion of memory cells. The method includes performing a read operation for selected memory cells that are in at least one of the first deck or the second deck; and applying a pass voltage to non-selected memory cells other than the selected memory cells in the first deck and the second deck. A first pass voltage is lower than a second pass voltage. The first pass voltage is applied to first non-selected memory cells in
(Continued)

the first portion, and the second pass voltage is applied to second non-selected memory cells in the second portion.

14 Claims, 15 Drawing Sheets

(51) Int. Cl.
  *G11C 5/02* (2006.01)
  *G11C 16/34* (2006.01)
  *G11C 16/04* (2006.01)
  *H10B 43/27* (2023.01)
(58) Field of Classification Search
  USPC .................................................. 365/185.17
  See application file for complete search history.

(56) References Cited

U.S. PATENT DOCUMENTS

| | | | |
|---|---|---|---|
| 2017/0154680 A1 | 6/2017 | Lee | |
| 2018/0374541 A1* | 12/2018 | Jung | G11C 16/20 |
| 2021/0098072 A1* | 4/2021 | Choi | G11C 29/18 |

FOREIGN PATENT DOCUMENTS

| | | | |
|---|---|---|---|
| CN | 108269598 A | 7/2018 | |
| CN | 109065091 A | 12/2018 | |
| CN | 110289259 A | 9/2019 | |
| CN | 110428859 A | 11/2019 | |
| CN | 110770837 A | 2/2020 | |
| CN | 112466368 A | 3/2021 | |

* cited by examiner

THREE-DIMENSIONAL MEMORY AND CONTROL METHOD THEREOF

CROSS-REFERENCE TO RELATED APPLICATIONS

This application is a continuation of International Application No. PCT/CN2021/122551, filed on Oct. 8, 2021, which claims the benefit of priority to C.N. Application No. 202011345682.1, filed on Nov. 26, 2020, both of which are hereby incorporated by reference in their entireties.

BACKGROUND

The present disclosure relates to the field of manufacturing of integrated circuits, in particular to a three-dimensional memory and a control method thereof.

To overcome the limitations of two-dimensional memory device, the industry has developed and produced in large scale memory device with three-dimensional (3D) structure, in which memory cells are arranged on a substrate three-dimensionally to increase the integration density. A 3D NAND flash is a three-dimensional memory device. Channel hole becomes deeper and deeper with the increase in the number of stack layers. Because an upper aperture is larger than a lower aperture of the channel hole, as the channel hole deepen, the differences between the upper aperture and the lower aperture of the channel hole will increase. When a read operation is performed for a three-dimensional memory, and when the same pass voltage is applied to each memory cell on a memory string formed by the same channel hole, if the aperture of the channel hole where the memory cells are located is relatively small, then the pass voltage brings higher electric field intensity to the memory cells, and read disturb will be caused to the memory cells after read for many times.

SUMMARY

The technical problem to be solved by the present disclosure is to provide a three-dimensional memory for reducing read disturb, and a control method thereof.

In order to solve the above technical problem, a technical solution adopted by the present disclosure is a control method of a three-dimensional memory, the three-dimensional memory comprising a first deck and a second deck that are stacked in a vertical direction of a substrate, the first deck and the second deck each comprising a plurality of memory strings, each memory string comprising a plurality of memory cells, the plurality of memory cells comprising a first portion and a second portion, wherein a diameter of a channel structure corresponding to the first portion of memory cells is smaller than that of the channel structure corresponding to the second portion of memory cells, the method comprising: performing a read operation for selected memory cells which are in at least one of the first deck or the second deck; and applying a pass voltage to non-selected memory cells other than the selected memory cells in the first deck and the second deck, the pass voltage comprising a first pass voltage and a second pass voltage, the first pass voltage being lower than the second pass voltage, wherein the first pass voltage is applied to first non-selected memory cells in the first portion, and the second pass voltage is applied to second non-selected memory cells in the second portion.

In an embodiment of the present disclosure, the method further comprises performing a program verify operation for the selected memory cells; and applying the pass voltage to the non-selected memory cells other than the selected memory cells in the first deck and the second deck, wherein the second pass voltage is applied to the second non-selected memory cells, and the pass voltage to be applied is determined according to states of the first non-selected memory cells, if the first non-selected memory cells are in a program state, the first pass voltage is applied to the first non-selected memory cells; if the first non-selected memory cells are in an erase state, the second pass voltage is applied to the first non-selected memory cells.

In an embodiment of the present disclosure, the memory cells in the memory strings are coupled to corresponding word lines through which the pass voltage is applied to the memory cells.

In an embodiment of the present disclosure, a read voltage is applied to the word lines of the selected memory cells when the read operation is performed for the selected memory cells.

In an embodiment of the present disclosure, a program verify voltage is applied to the word lines of the selected memory cells when the program verify operation is performed for the selected memory cells.

In an embodiment of the present disclosure, each memory cell is located at a corresponding cell depth in the memory strings, and a program operation is performed for a page of the memory cells located at the same cell depth through the word lines layer by layer in an extension direction of the channel structure of the memory strings.

In order to solve the above technical problem, the present disclosure further proposes a three-dimensional memory comprising a memory cell array comprising a first deck and a second deck that are stacked in a vertical direction of a substrate, the first deck and the second deck each comprising a plurality of memory strings, each memory string extending vertically above the substrate and comprising a plurality of memory cells that are arranged vertically in series connection; the plurality of memory cells comprising a first portion and a second portion, a diameter of a channel structure of the first portion of memory cells being smaller than that of the channel structure of the second portion of memory cells; and a controller configured to transmit a control signal to a voltage controller when a read operation is performed for selected memory cells, the voltage controller applying a pass voltage comprising a first pass voltage and a second pass voltage to non-selected memory cells in response to the control signal, the first pass voltage being lower than the second pass voltage, wherein the first pass voltage is applied to first non-selected memory cells in the first portion, and the second pass voltage is applied to second non-selected memory cells in the second portion.

In an embodiment of the present disclosure, the controller is further configured to transmit a control signal to the voltage controller when a program verify operation is performed for selected memory cells, the voltage controller applying the second pass voltage to the second non-selected memory cells in response to the control signal, applying the first pass voltage to the first non-selected memory cells if the first non-selected memory cells are in a program state; and applying the second pass voltage to the first non-selected memory cells if the first non-selected memory cells are in an erase state.

In an embodiment of the present disclosure, the three-dimensional memory further comprises a plurality of word lines, each of which is coupled with a page of memory cells at the same cell depth, wherein each memory cell is located at a corresponding cell depth in the memory strings.

In an embodiment of the present disclosure, the diameter of the channel structure of the memory strings gradually increases from the bottom to the top of the memory strings.

In an embodiment of the present disclosure, the first portion of memory cells is located below the second portion of memory cells.

In an embodiment of the present disclosure, the memory strings comprise first memory string and second memory string which are stacked in an extension direction of the channel structure, the diameter of the channel structure of the first memory string gradually increasing from the bottom to the top of the first memory string, and the diameter of the channel structure of the second memory string gradually increasing from the bottom to the top of the second memory string.

In an embodiment of the present disclosure, the diameter of the channel structure at the top of the first memory string is larger than that of the channel structure at the bottom of the second memory string.

In an embodiment of the present disclosure, the three-dimensional memory is a 3D NAND flash.

According to the three-dimensional memory and the control method thereof of the present disclosure, the first pass voltage lower than a normal pass voltage is applied to the memory cells of which the diameter of the channel structure is relatively small, which can reduce the read disturb of this portion of memory cells. Moreover, at a program verify stage, the relatively low first pass voltage is also applied to the memory cells with relatively small-aperture channel structure, thereby further reducing the read disturb of this portion of memory cells and improving the reliability of the three-dimensional memory.

BRIEF DESCRIPTION OF THE DRAWINGS

To make the above purposes, features and advantages of the present disclosure more apparent and readily understood, the specific implementations of the present disclosure will be described below in detail in conjunction with the drawings, in which.

DETAILED DESCRIPTION

Figure 1:
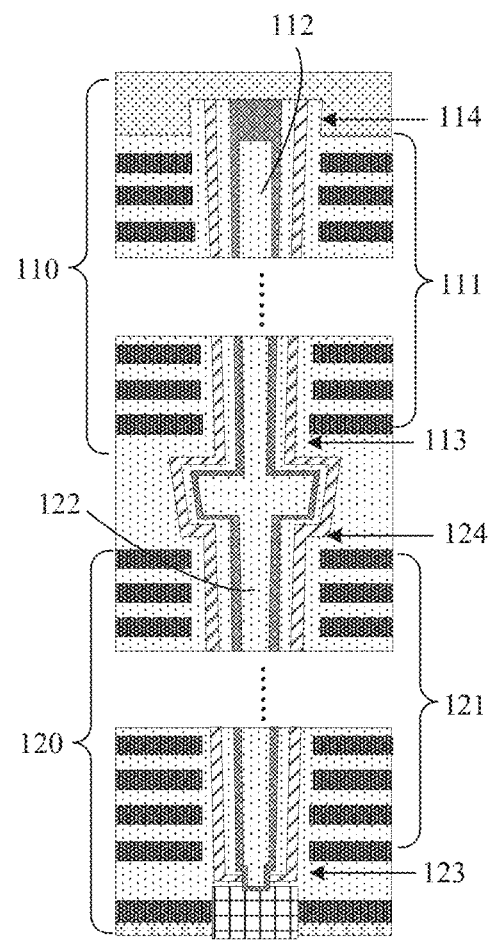
FIG. 1 is a structural diagram of part of a three-dimensional memory with a plurality of decks.

To make the above purposes, features and advantages of the present disclosure more apparent and readily understood, the specific implementations of the present disclosure will be described below in detail in conjunction with the drawings.

The description below sets forth more concrete details for ease of adequate understanding of the present disclosure. The present disclosure, however, may also be implemented by other manners than those described herein. Thus, the present disclosure is not restricted by specific embodiments disclosed below.

As shown in the present application and claims, terms, such as "a", "an" and/or "the", do not refer in particular to a singular sense, but also include a plural sense, except for exceptions as clearly indicated by context. Generally speaking, terms, "comprise" and "include", only indicate that a method or an apparatus comprises steps and elements that have been identified clearly, which do not constitute an exclusive enumeration, and the method or the apparatus may also comprise other steps or elements.

When embodiments of the present disclosure are detailed, for ease of illustration, a sectional drawing representing a device structure will be partially enlarged not to general scale, and the schematic diagram is merely exemplary and should not restrict the protection scope of the present disclosure herein. Furthermore, three-dimensional spatial sizes of length, width and depth, should be included in practical fabrication.

For ease of description, spatial relationship terms, such as "under", "below", "lower", "beneath", "above", "on", and the like, may be used herein to describe one element or feature's relationship to other element or feature as illustrated in the figures. It is understood that, these spatial relationship terms are intended to include other directions of a device in use or operation than those as depicted in the figures. For example, if a device in the figures is flipped, then a direction of an element described to be "below", or "under", or "beneath" other element or feature will be changed to "above" the other element or feature. Thus, the exemplary terms, "below" and "beneath", may include upper and lower directions. The device may also have other orientations (rotated 90 degrees or in other directions), and thus, the spatial relationship terms as used herein should be interpreted accordingly. Moreover, it is further understood that, when one layer is described as "between" two layers, it may be the only layer between the two layers, or there may also be one or more layers intervening therebetween.

In context of the present application, a structure which is described that a first feature is "over" a second feature may comprise embodiment that the first and second features are in direct contact, and may also comprise embodiment that another feature is formed between the first and second features such that the first and second features may not be in direct contact.

Further, it should be noted that, terms, such as "first", "second", and the like, which are used to define components, are merely for ease of differentiation of corresponding components. Unless otherwise stated, the above terms do not have special meanings, and thus cannot be construed to restrict the protection scope of the present application.

As used herein, the term "three-dimensional (3D) memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

As used herein, the term "substrate" refers to a material onto which subsequent material layers are added. The substrate itself can be patterned. Materials added on top of the substrate can be patterned or can remain unpatterned. Furthermore, the substrate can include a variety of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines and/or via holes are formed) and one or more dielectric layers.

In the present application, a flow diagram is used to illustrate operations carried out by a system according to embodiments of the present application. It should be understood that, the foregoing or following operations may not be necessarily carried out accurately in order. On the contrary, respective steps may be processed in a reverse order or simultaneously. Meanwhile, alternatively, other operations are added to these processes; alternatively, some step or steps of operations are removed from these processes.

FIG. 1 is a structural diagram of part of a three-dimensional memory with a plurality of decks. Referring to FIG. 1, the three-dimensional memory comprises two decks, a first deck 110 and a second deck 120, respectively. Each deck comprises stack structures 111, 121 formed by alternative stack of gate layers and dielectric layers, and channel hole structures 112, 122 formed in the stack structures 111, 121. As shown in FIG. 1, in the first deck 110, an aperture at a top 114 of the channel hole structure 112 is larger than the aperture at a bottom 113. In the second deck 120, the aperture at the top 124 of the channel hole structure 122 is larger than the aperture at the bottom 123. At an interface between the first deck 110 and the second deck 120, the aperture of the channel hole at the bottom 113 of the first deck 110 is smaller than that of the channel hole at the top 124 of the second deck 120.

In a practical three-dimensional memory structure, the aperture of the channel hole gradually decreases from the top to the bottom of the channel hole in an extension direction of the channel hole structure. As the number of stack layers in the stack structures 111, 121 increases, the channel hole structures 112, 122 become deeper and deeper, and their depth-to-width ratios become larger and larger, causing that difference between the aperture at the top and the aperture at the bottom of the channel hole structures 112, 122 become larger and larger.

Figure 2A:
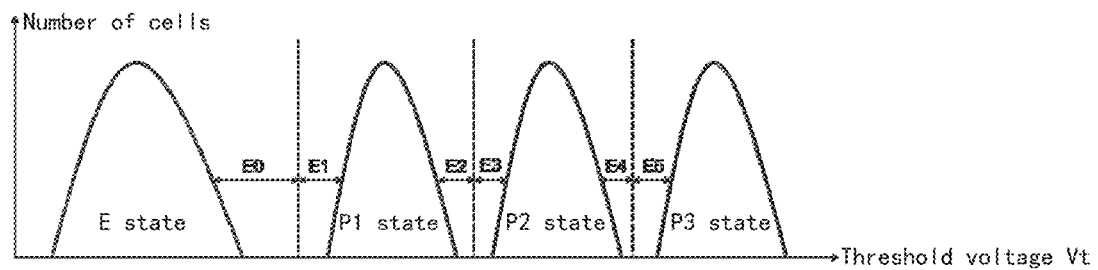
FIGS. 2A and 2B are distribution diagrams of a threshold voltage of memory cells in a three-dimensional memory.
Figure 2B:
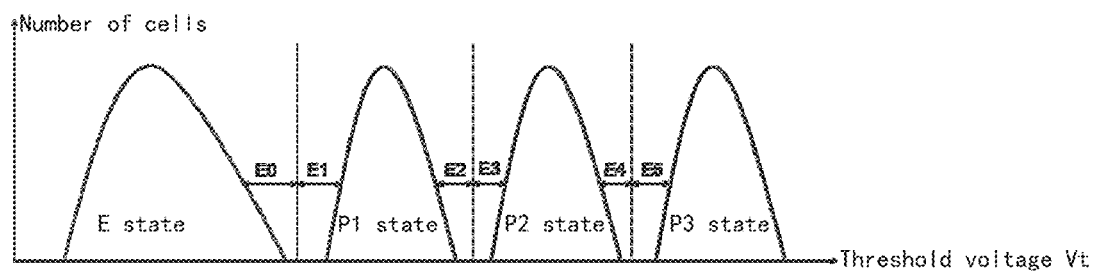

FIGS. 2A and 2B are distribution diagrams of a threshold voltage of memory cells in a three-dimensional memory, in which the horizontal axis represents a threshold voltage Vt, and the vertical axis represents the number of memory cells. FIGS. 2A and 2B take a multi-level cell (MLC) technology as an example, according to which, each memory cell stores two-bit information, i.e., 00, 01, 10 and 11. The threshold voltages of the memory cells may be in four different states, i.e., an E state, a P1 state, a P2 state and a P3 state as shown in FIGS. 2A and 2B. Among them, the E state is an erase state corresponding to an erase action, with a corresponding data format being 11, and the P1 state, the P2 state and the P3 state are program states corresponding to a program action, with corresponding data formats being 00, 01 and 10, respectively.

FIG. 2A is a distribution diagram of a threshold voltage under a normal state. Referring to FIG. 2A, there is a margin distance between the respective states, which is divided into multiple margins, for example, an E0 margin and an E1 margin between the E state and the P1 state, in which the E0 margin is close to the E state, and the E1 margin is close to the P1 state. Similarly, the margin distances between the P1 state, the P2 state and the P3 state are divided into an E2 margin, an E3 margin, an E4 margin and an E5 margin.

When a read operation is performed for the memory cells, a read voltage (Vread) is applied to a gate of a read memory cell, and a pass voltage (Vpass) is applied to other memory cells on the same memory string as the read memory cell, such that these memory cells are in an turn-on state. The pass voltage is also called as transmission voltage or turn-on voltage. The memory string may be construed as a string of memory cells distributed along the channel hole structure as shown in FIG. 1. For the small-aperture memory cell at the bottom of the channel hole structure, the pass voltage brings a high electric field intensity and a strong tunneling effect, and produces a certain program effect on the memory cell. Particularly for the memory cell in the erase state, due to its low threshold voltage, it is susceptible to the program effect of the pass voltage, thereby broadening the distribution of the erase state E state, for example as shown in FIG. 2B.

FIG. 2B is a distribution diagram of a threshold voltage when the distribution of the erase state is broadened. Referring to FIG. 2B, the voltage distribution of the E0 state is broadened in a direction close to the P1 state, resulting in decrease of the E0 margin. Due to the decrease of the E0 margin, a read error for the memory cell in the E state may be caused, thereby resulting in read disturb and reducing the reliability of data storage.

Figure 3:
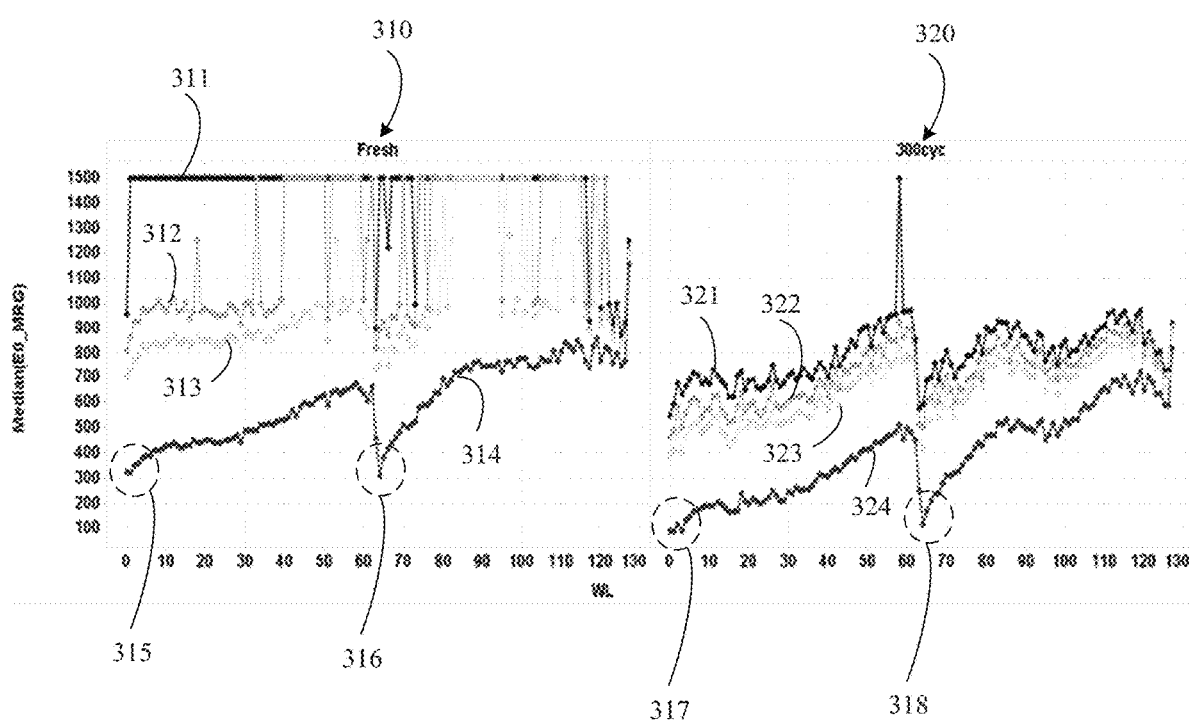
FIG. 3 is a schematic diagram of influence of read disturb on an E0 margin.

FIG. 3 is a schematic diagram of influence of read disturb on an E0 margin. As shown in FIG. 3, its horizontal axis represents the numbers of word lines (WLs) of three-dimensional memory from 0 to 127, indicating that the three-dimensional memory is a 128-layers 3D NAND flash. Moreover, the three-dimensional memory comprises 2 decks as shown in FIG. 1. The vertical axis in FIG. 3 represents a width value of the E0 margin, which is a median of several test results. Referring to FIG. 3, a left half portion 310 of the horizontal axis shows an original state (Fresh) of the memory cells without going through program, and a right half portion 320 shows a state of the memory cells after 300 cycles (300 cyc) of program.

Referring to FIG. 3, the left half portion 310 and the right half portion 320 each comprises four curves corresponding to different times of reads. Among them, the times of reads corresponding to curves 311 and 321 are 0, the times of reads corresponding to curves 312 and 322 are 1000, the times of reads corresponding to curves 313 and 323 are 3000, and the times of reads corresponding to curves 314 and 324 are 30000. Apparently, the E0 margin gradually decreases with the increase in the times of reads. FIG. 3 corresponds to the three-dimensional memory with 2 decks as shown in FIG. 1, in which word lines No. 0-63 belong to the first deck, with the numbers gradually increasing from the bottom of the channel hole structure up, and word lines No. 64-127 belong to the second deck.

Taking the left half portion 310 as an example, in conjunction with FIGS. 1 and 3, the word line No. 0 corresponds to the memory cell at the bottom of the channel hole structure. After several read operations, the size of the E0 margin of the memory cell in the first deck increases with the increase of the word line number (0-63), and the size of the E0 margin of the memory cell in the second deck also increases with the increase of the word line number (64-127). Thus, the E0 margin of the memory cell at the bottom of the deck is the smallest, for example, a first area 315 and a second area 316 as circled by dotted circles in FIG. 3, which correspond to a memory cell at the bottom of the first deck and a memory cell at the bottom of the second deck respectively.

In the right half portion 320, the E0 margins of the memory cells after 300 cycles of program are somewhat smaller than the E0 margins of the memory cells in the original state without going through the program. Besides, similar to the left half portion 310, the E0 margins of the memory cells at the bottom of the first deck and at the bottom of the second deck are relatively small, for example, a third area 317 and a fourth area 318 as circled by dotted circles in FIG. 3.

Figure 4:
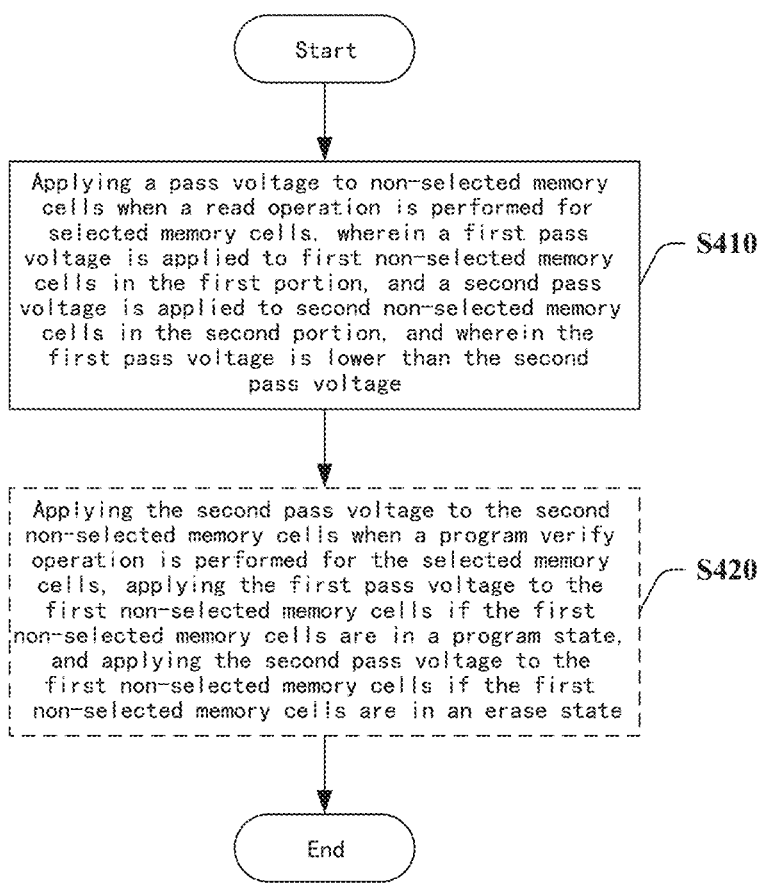
FIG. 4 is an exemplary flow diagram of a control method of a three-dimensional memory according to an embodiment of the present disclosure.

FIG. 4 is an exemplary flow diagram of a control method of a three-dimensional memory according to an embodiment of the present disclosure. The three-dimensional memory comprises a plurality of memory strings each comprising a plurality of memory cells which comprise a first portion and a second portion, in which the diameter of the channel structure corresponding to the first portion of memory cells is smaller than that of the channel structure corresponding to the second portion of memory cells. Referring to FIG. 4, the control method of the embodiment comprises:

Step S410: Applying a pass voltage to non-selected memory cells when a read operation is performed for selected memory cells, wherein a first pass voltage is applied to first non-selected memory cells in the first portion, and a second pass voltage is applied to second non-selected memory cells in the second portion, and wherein the first pass voltage is lower than the second pass voltage.

In some embodiments, the memory cells in the memory strings of the three-dimensional memory are coupled to the corresponding word lines to which the pass voltage is applied, thereby achieving the effect of applying the pass voltage to the memory cells.

In some embodiments, a read voltage is applied to word lines of the selected memory cells when the read operation is performed for the selected memory cells.

FIGS. 5A-5D are implementation schematic diagrams of a control method of a three-dimensional memory according to an embodiment of the present disclosure. The control method as shown in FIG. 4 is described below in conjunction with FIGS. 5A-5D.

Figure 5A:
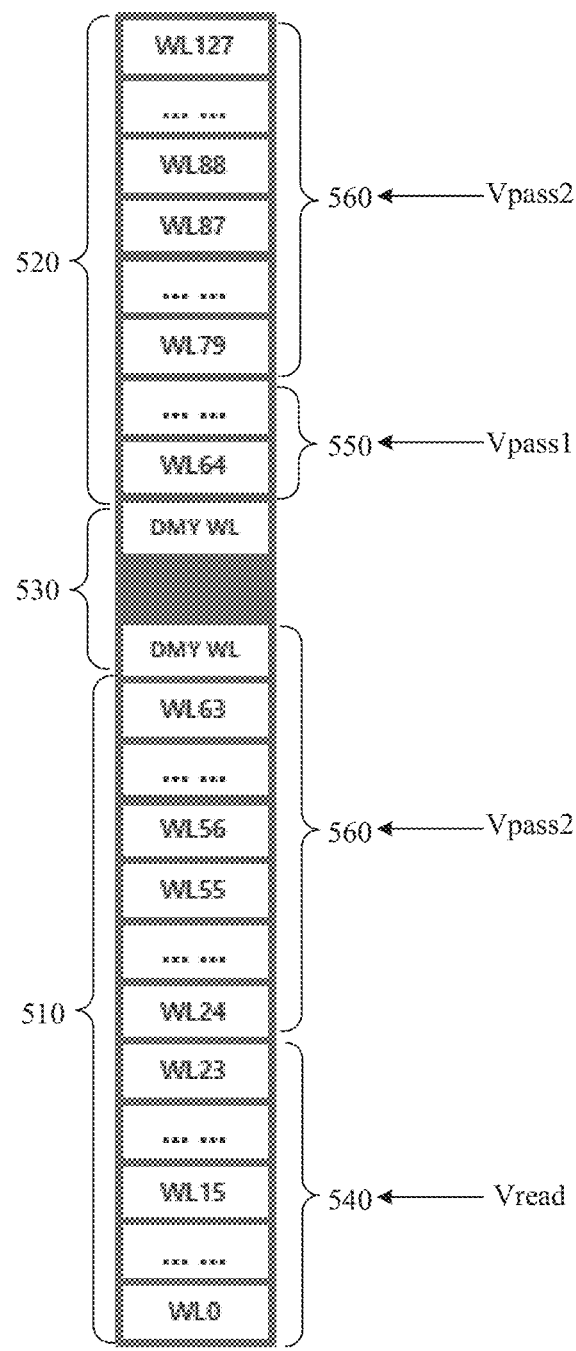
FIGS. 5A-5D are implementation schematic diagrams of a control method of a three-dimensional memory according to an embodiment of the present disclosure.

Referring to FIG. 5A, a structural diagram of a 128-layers three-dimensional memory with 2 decks is shown therein. The three-dimensional memory comprises a first deck 510 located at a lower part, and a second deck 520 located at an upper part. The first deck 510 comprises 64 gate layers, WL0-WL63, and the second deck 520 also comprises 64 gate layers, WL64-WL127. It further comprises some virtual gate layers 530 between the first deck 510 and the second deck 520, which do not produce a practical gate effect. It is understood that, in a structure of the three-dimensional memory, word lines are connected with the gate layers, and a voltage may be applied through the word lines to the gate layers connected with the word lines. In FIGS. 5A-5D, WL (word line) is used to represent name of the gate layer connected with the different word line.

In this embodiment, the diameter of the channel structure corresponding to the memory cells is the aperture of the channel hole structure as shown in FIG. 1.

In conjunction with FIGS. 1 and 5A, the aperture of the channel structure corresponding to the memory cells relevant to several gate layers at the bottom in the first deck 510 are relatively small, assuming the number of several gate layers is about 15-20, that is, the gate layers where the first portion of memory cells is located are from WL0-WL14 to WL0-WL19.

The present disclosure neither limits the number of memory cells of the first portion and the second portion, nor limits the number of corresponding gate layers. In practical implementation of the control method, the scope of the gate layers where the first portion and the second portion of memory cells are located may be set as required.

The present disclosure is described by taking 16 layers as an example. Referring to FIG. 5A, the memory cells corresponding to WL0-WL15 and WL64-WL79 belong to the first portion in Step S410, and the memory cells in the rest of gate layers belong to the second portion.

In order to describe Step S410, it will be described according to the numbers of the gate layers where the selected memory cells are located, respectively.

In FIG. 5A, the selected memory cells 540 are between WL0 and WL23, and the memory cells located in other gate layers are non-selected memory cells, including WL24-WL127. When the read voltage Vread is applied to the selected memory cells 540, the pass voltage Vpass is applied to the other non-selected memory cells. In these non-selected memory cells, the memory cells located in WL64-WL78 belong to the first portion, and this portion of non-selected memory cells is called as first non-selected memory cells 550. The rest belongs to the second portion, including the memory cells located in WL24-WL63 and WL79-WL127, and these non-selected memory cells is called as second non-selected memory cells 560. According to Step S410, a first pass voltage Vpass1 is applied to the first non-selected memory cells 550 belonging to the first portion, and a second pass voltage Vpass2 is applied to the second non-selected memory cells 560 belonging to the second portion, wherein Vpass1<Vpass2.

It should be noted that, the selected memory cells 540 between WL0 and WL23 means that the selected memory cells 540 are located in any one or more layers between WL0 and W23. The selected memory cells 540 may be located in different memory strings, but the diameter of the channel structure corresponding to the memory cells 540 located on the same gate layer but in different memory strings are approximately the same. If the selected memory cells 540 are in the layer WL15, then the pass voltage is applied to the memory cells on the gate layers WL0-W23 except WL15 similarly according to the principle of Step S410, that is, the first pass voltage Vpass1 is applied to WL0-WL14 belonging to the first portion, and the second pass voltage Vpass2 is applied to WL16-WL23 belonging to the second portion.

Figure 5B:
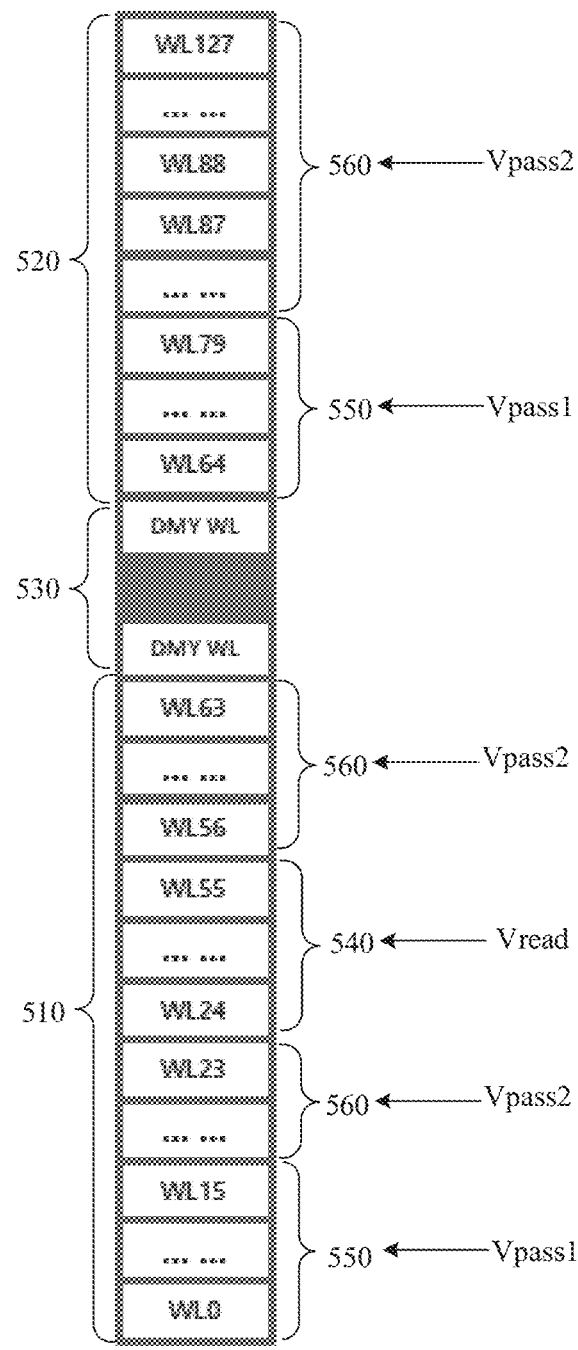

In FIG. 5B, the selected memory cells 540 are between WL24 and WL55, and the memory cells located in other gate layers are non-selected memory cells. When the read voltage Vread is applied to the selected memory cells 540, the pass voltage Vpass is applied to the other non-selected memory cells. Among these non-selected memory cells, the first non-selected memory cells 550 comprise memory cells located in the gate layers WL0-WL15 and WL64-WL79, and the second non-selected memory cells 560 comprise memory cells located in the gate layers WL16-WL23, WL56-WL63, and WL80-WL127.

According to Step S410, the first pass voltage Vpass1 is applied to the first non-selected memory cells 550, and the second pass voltage Vpass2 is applied to the second non-selected memory cells 560, wherein Vpass1<Vpass2.

Figure 5C:
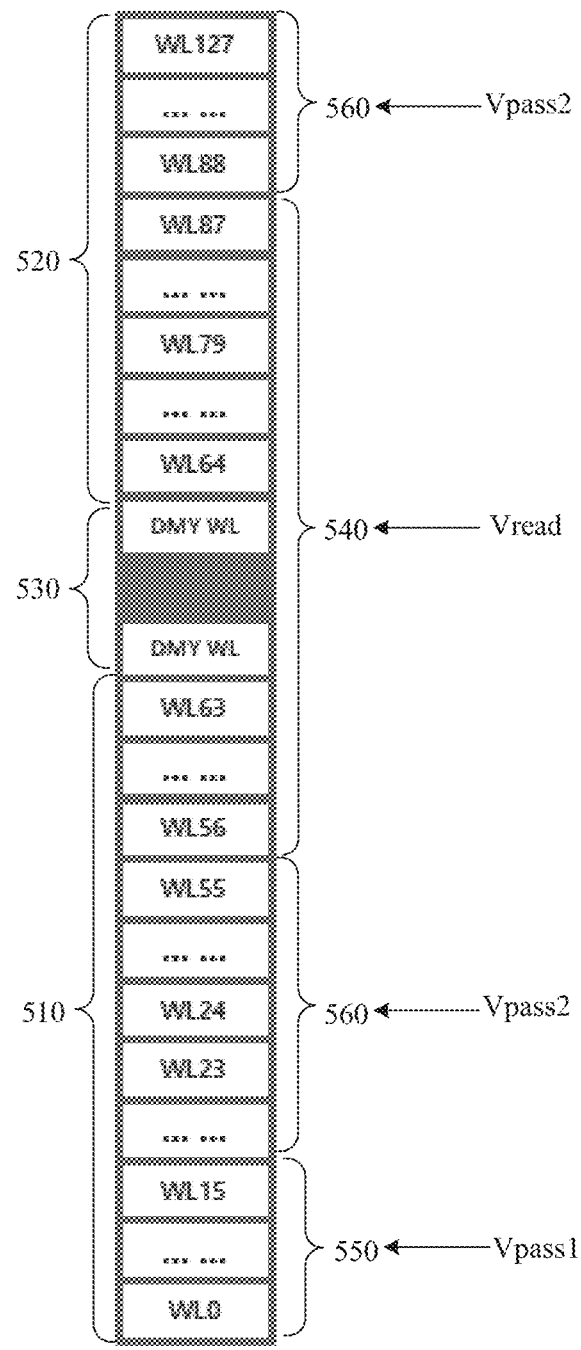

In FIG. 5C, the selected memory cells 540 are between WL56 and WL87, and the memory cells located in other gate layers are non-selected memory cells. When the read voltage Vread is applied to the selected memory cells 540, the pass voltage Vpass is applied to the other non-selected memory cells. Among these non-selected memory cells, the first non-selected memory cells 550 comprise memory cells located in the gate layers WL0-WL15, and the second non-selected memory cells 560 comprise memory cells located in the gate layers WL16-WL55 and WL88-WL127. According to Step S410, the first pass voltage Vpass1 is applied to the first non-selected memory cells 550, and the second pass voltage Vpass2 is applied to the second non-selected memory cells 560, wherein Vpass1<Vpass2.

Figure 5D:
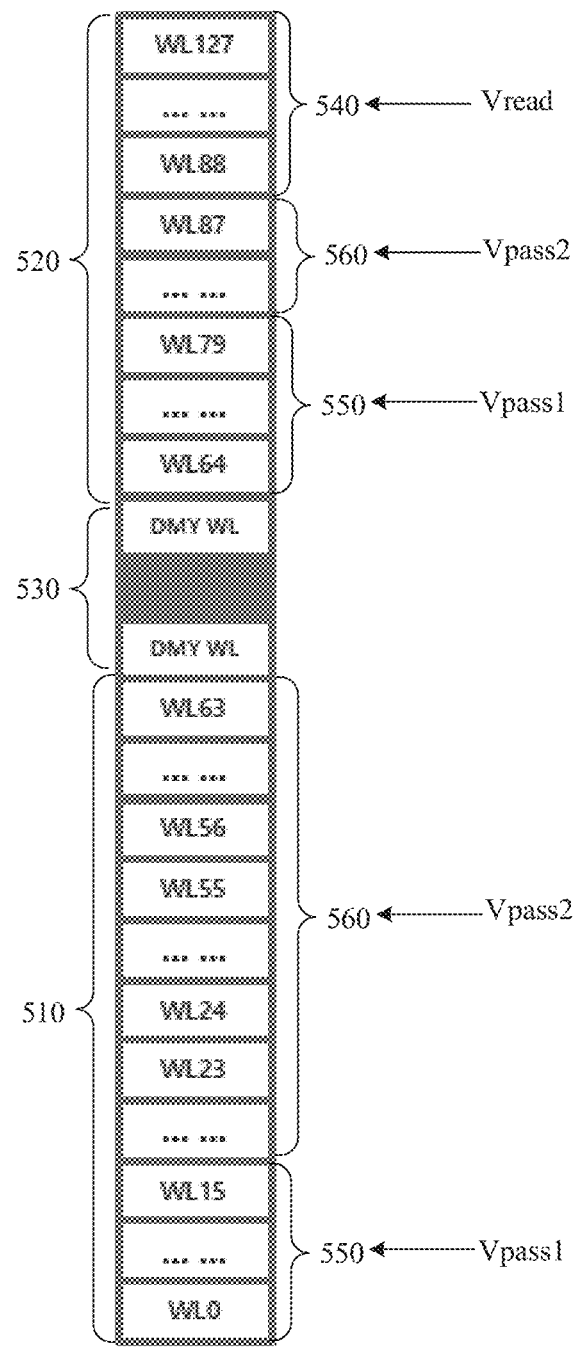

In FIG. 5D, the selected memory cells 540 are between WL88 and WL127, and the memory cells located in other gate layers are non-selected memory cells. When the read voltage Vread is applied to the selected memory cells 540, the pass voltage Vpass is applied to the other non-selected memory cells. Among these non-selected memory cells, the first non-selected memory cells 550 comprise memory cells located in the gate layers WL0-WL15 and WL64-WL79, and the second non-selected memory cells 560 comprise memory cells located in the gate layers WL16-WL63 and WL80-WL87. According to Step S410, the first pass voltage Vpass1 is applied to the first non-selected memory cells 550, and the second pass voltage Vpass2 is applied to the second non-selected memory cells 560, wherein Vpass1<Vpass2.

In the above embodiment, the second pass voltage may be a normal pass voltage typically used, for example, Vpass2=6.5-7 V. The first pass voltage is lower than the normal pass voltage, for example, Vpass1=6-6.5 V. The first pass voltage Vpass1 is about 0.5 V lower than the second pass voltage Vpass2.

Figure 6:
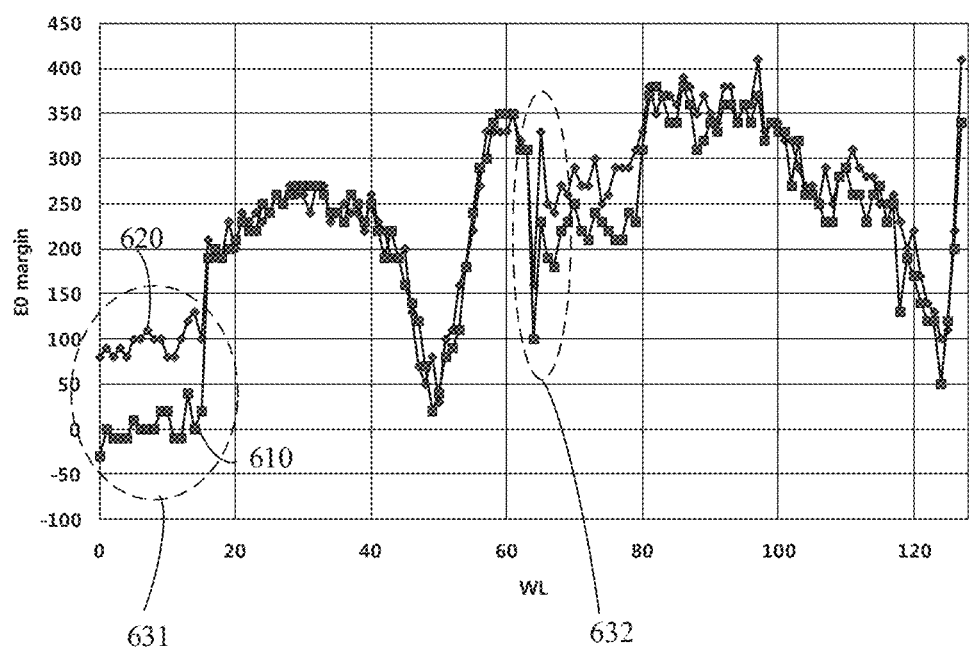
FIG. 6 is an effect schematic diagram of a control method of a three-dimensional memory according to an embodiment of the present disclosure.

FIG. 6 is an effect schematic diagram of a control method of a three-dimensional memory according to an embodiment of the present disclosure. Referring to FIG. 6, its horizontal axis represents word line numbers of the three-dimensional memory, from 0 to 127, and its vertical axis represents a width of an E0 margin. FIG. 6 illustrates an average of the E0 margin obtained after 30000 cycles of read operations. A curve 610 shows a condition that the second pass voltage Vpass2 is applied to all the non-selected cells, and a curve 620 shows a condition that the first pass voltage Vpass1 is applied to the first non-selected memory cells, and the second pass voltage Vpass2 is applied to the second non-selected memory cells.

In the embodiment as shown in FIG. 6, Vpass1=6.2 V, and Vpass2=6.6 V. As shown in FIG. 6, for the memory cells in the vicinity of WL0-WL16 at the bottommost of the channel structure, Y-axis values of the curve 620 are greater than those of the curve 610, that is, the method of the present disclosure increases the E0 margins of the memory cells in the vicinity of WL0-WL16.

According to the control method of the three-dimensional memory above-described, the first pass voltage lower than the normal pass voltage is applied to the memory cells of which the diameter of channel structure is relatively small, which can reduce the read disturb of this portion of memory cells.

Referring to FIG. 4, in some embodiments, the control method of the three-dimensional memory of the present disclosure further comprises:

Step 420: applying the second pass voltage to the second non-selected memory cells when a program verify operation is performed for the selected memory cells, applying the first pass voltage to the first non-selected memory cells if the first non-selected memory cells are in a program state, and applying the second pass voltage to the first non-selected memory cells if the first non-selected memory cells are in an erase state. Step 420 is described below in conjunction with FIGS. 7A-7D.

In some embodiments, a program verify voltage is applied to the word lines of the selected memory cells when the program verify operation is performed for the selected memory cells.

FIGS. 7A-7D are implementation schematic diagrams of a control method of a three-dimensional memory according to an embodiment of the present disclosure. FIGS. 7A-7D illustrate four different situations of the numbers of the gate layers where the selected memory cells are located, respectively.

Figure 7A:
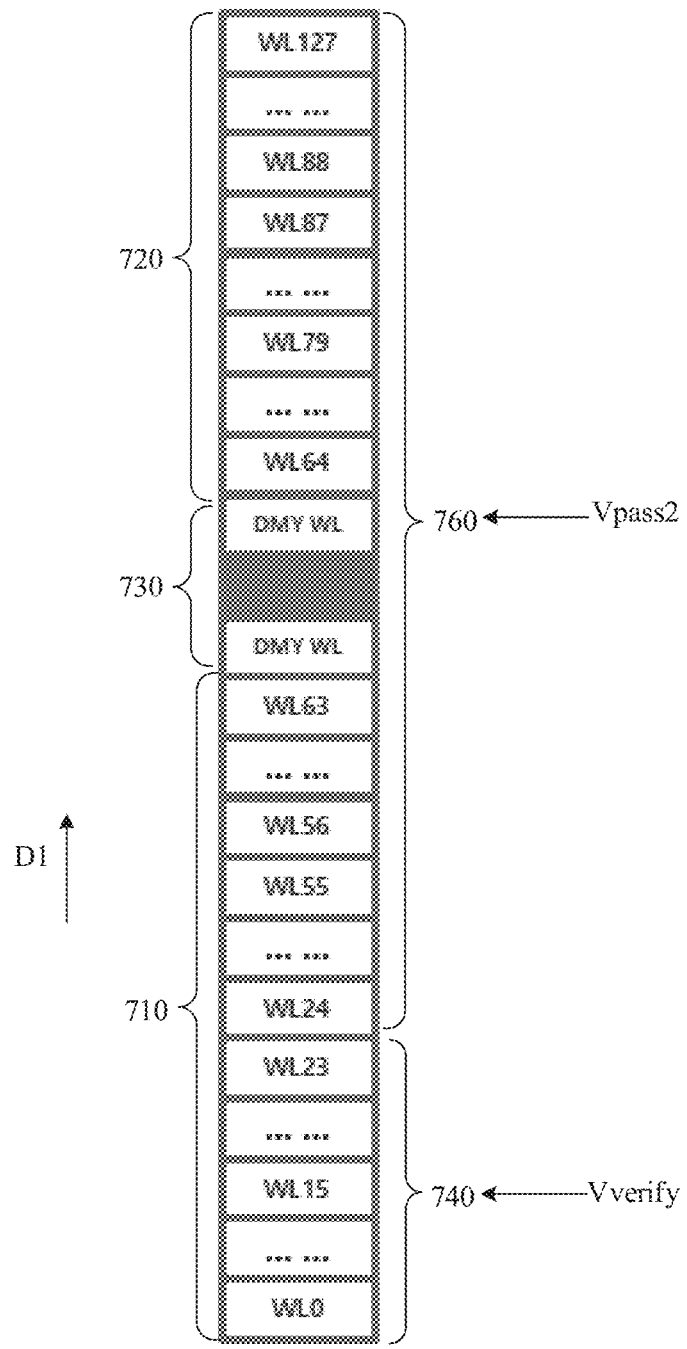
FIGS. 7A-7D are implementation schematic diagrams of a control method of a three-dimensional memory according to an embodiment of the present disclosure.

Referring to FIG. 7A, it shows a structural diagram of a 128-layers three-dimensional memory with 2 decks, similar to FIG. 5A. It comprises a first deck 710 located at a lower part, and a second deck 720 located at an upper part. The first deck 710 comprises 64 gate layers, WL0-WL63, and the second deck 720 also comprises 64 gate layers, WL64-WL127. It further comprises some virtual gate layers 730 between the first deck 710 and the second deck 720, which do not produce a practical gate layer effect. Let the memory cells in the gate layers WL0-WL15 and WL64-WL79 correspond to the first portion with a small-aperture channel structure, and the memory cells in the rest of gate layers correspond to the second portion with a large-aperture channel structure.

In FIG. 7A, the selected memory cells 740 are between WL0 and WL23, and the memory cells located in the other gate layers are non-selected memory cells, including WL24-WL127. When the program verify voltage Vverify is applied to the selected memory cells 740, the pass voltage Vpass is applied to the other non-selected memory cells.

In some embodiments, each memory cell is located at a corresponding cell depth in a memory string, and the program operation is performed for a page of the memory cells located at the same cell depth through the word line layer by layer in an extension direction of the channel structure of the memory string. Referring to FIG. 7A, in the embodiment, the word line number increases layer by layer in a first direction D1 which also corresponds to the extension direction of the channel structure of the memory string. WL0 corresponds to the bottom of the channel structure, and WL127 corresponds to the top of the channel structure. Further, WL0 corresponds to the bottom of the channel structure of the first deck 710, and WL63 corresponds to the top of the channel structure of the first deck 710; WL64 corresponds to the bottom of the channel structure of the second deck 720, and WL127 corresponds to the top of the channel structure of the second deck 720.

The memory cells in the same gate layer have the same cell depth, and the memory cells at the same cell depth form a page of the three-dimensional memory. In the embodiment as shown in FIGS. 7A-7D, the program operation starts from the bottommost layer WL0 upwards layer by layer.

During the program operation (which may be also construed as write data), the memory cells are programmed according to a word line program order or other program rules. For example, the program operation may start from a word line at a source side of a memory block, and continues to a word line at a drain side of the memory block. In one program rule, after the program of each word line is completed, it comes to the program of the next word line (i.e., program in pages). During the program operation, one or more layers in the three-dimensional memory are selected as select layers; a program voltage is applied to the select layers, a bit line voltage is not applied to bit lines corresponding to a select string, that is, the bit lines corresponding to the select string are grounded for the program operation for the select string, while a suppression operation is performed for other memory strings.

Referring to FIG. 7A, the selected memory cells 740 are located between the gate layers WL0-WL23, and may be one or more layers among them. In this state, the other gate layers WL24-WL127 have not gone through the program operation and are in the erase state. Thus, the pass voltages Vpass applied to the non-selected memory cells in WL24-WL127 are the second pass voltage Vpass2.

Figure 7B:
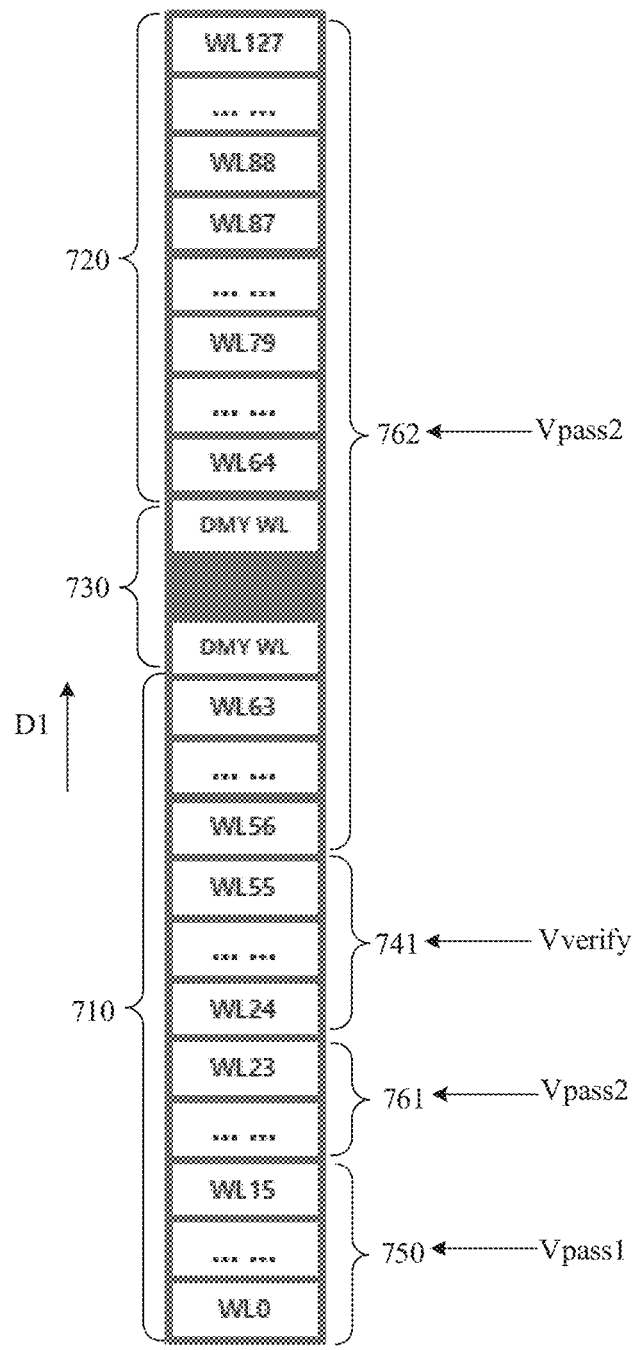

In FIG. 7B, the selected memory cells 741 are between WL24 and WL55, and the memory cells located in other gate layers are non-selected memory cells. When the program verify voltage Vverify is applied to the selected memory cells 741, the pass voltage Vpass is applied to the other non-selected memory cells. Among these non-selected memory cells, the second pass voltage Vpass2 is applied to the second non-selected memory cells 761. The first non-selected memory cells 750 at the gate layers WL0-WL15 have gone through the program operation as shown in FIG. 7A and are in the program state, and thus, the first pass voltage Vpass 1 is applied to the first non-selected memory cells 750. The non-selected memory cells 762 located in the gate layers WL56-WL127 are in the erase state, and thus, the second pass voltage Vpass2 is applied to these non-selected memory cells 762, wherein Vpass1<Vpass2. The non-selected memory cells 762 comprise first non-selected memory cells WL64-WL79 belonging to the first portion, and second non-selected memory cells WL80-127 belonging to the second portion.

Figure 7C:
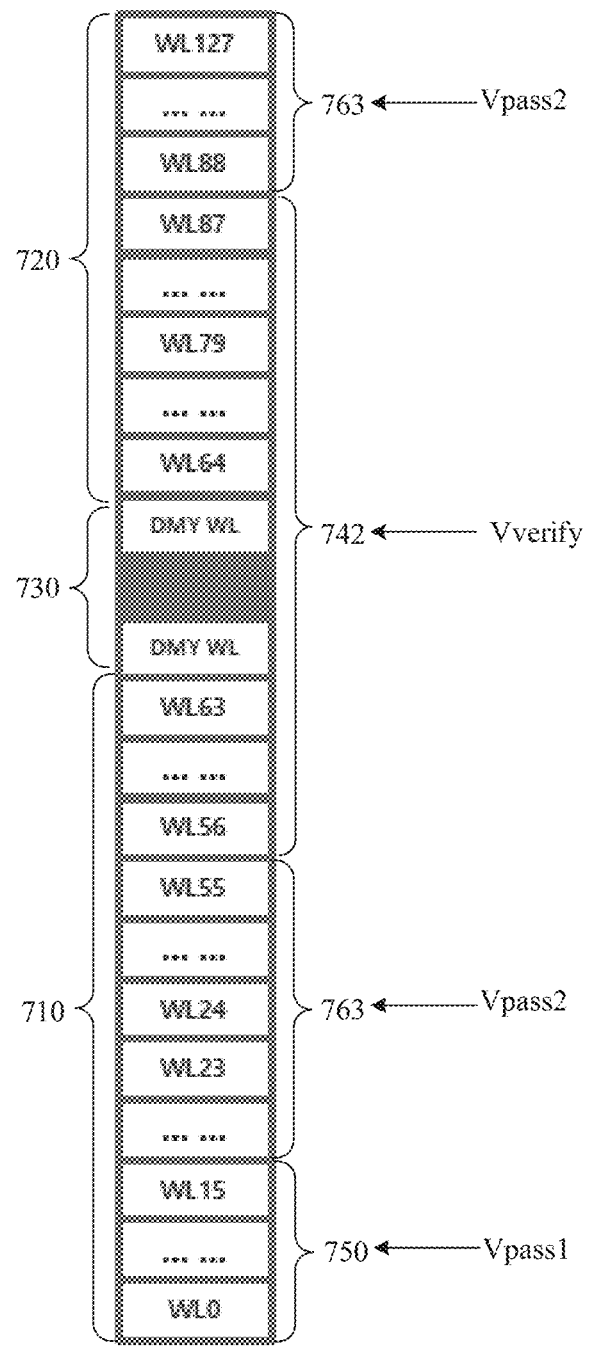

In FIG. 7C, the selected memory cells 742 are between WL56 and WL87, and the memory cells located in the other gate layers are non-selected memory cells. When the program verify voltage Vverify is applied to the selected memory cells 742, the pass voltage Vpass is applied to the other non-selected memory cells. Among these non-selected memory cells, the second pass voltage Vpass2 is applied to the second non-selected memory cells 763 which comprise memory cells located in the gate layers WL16-WL55 and WL88-WL127. The non-selected memory cells further comprise the first non-selected memory cells 750 located in the gate layers WL0-WL15, which have gone through the program operation as shown in FIG. 7A and are in the program state, and thus, the first pass voltage Vpass1 is applied to the first non-selected memory cells 750.

Figure 7D:
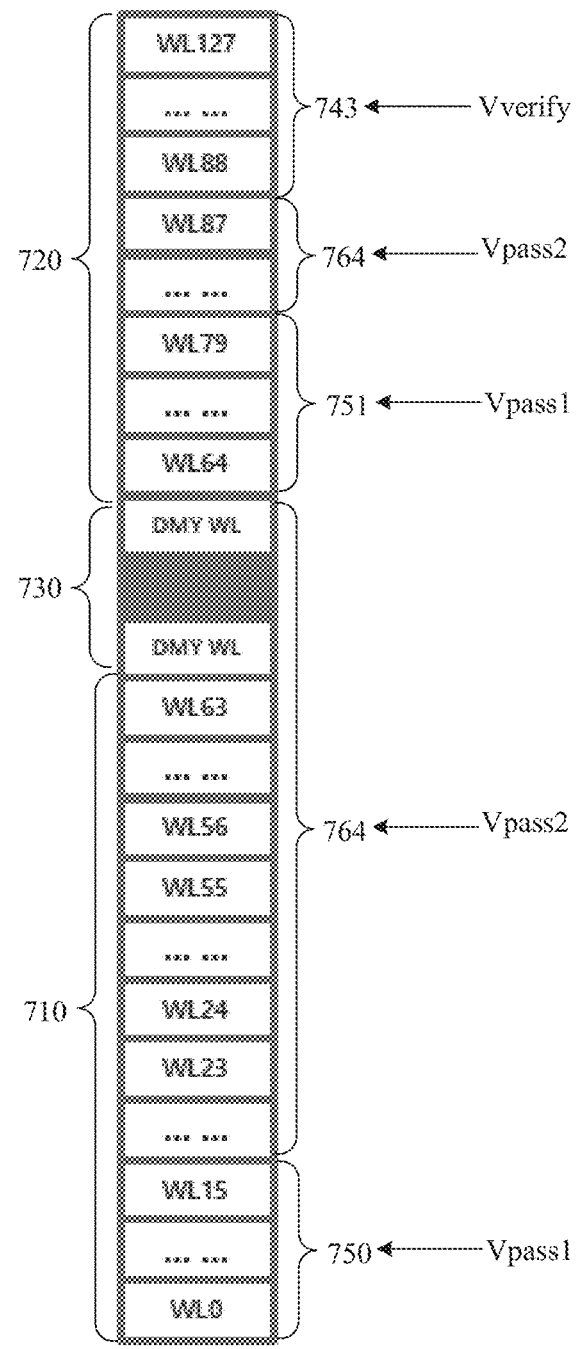

In FIG. 7D, the selected memory cells 743 are between WL88 and WL127, and the memory cells located in the other gate layers are non-selected memory cells. When the program verify voltage Vverify is applied to the selected memory cells 743, the pass voltage Vpass is applied to the other non-selected memory cells. Among these non-selected memory cells, the second pass voltage Vpass2 is applied to the second non-selected memory cells 764 which comprise memory cells located in the gate layers WL16-WL63 and WL80-WL87. The non-selected memory cells further comprise the first non-selected memory cells 750 in the gate layers WL0-WL15 and the first non-selected memory cells 751 in the gate layers WL64-WL79, which have gone through the program operation as shown in FIG. 7A and are in the program state, and thus, the first pass voltage Vpass1 is applied to the first non-selected memory cells 750, 751.

Application of the program verify voltage Vverify to the memory cells is equivalent to a read operation, which will also result in read disturb for the memory cells with relatively small apertures. According to the control method of the above embodiment, the read disturb of the program verify voltage may be reduced in the meantime.

FIGS. 7A-7D illustrate embodiment in which the program operation starts from the gate layer WL0 to WL127 layer by layer. In other embodiments, the program operation may be performed from the gate layer WL127 downwards layer by layer until WL0, and the above operation method also applies to these embodiments.

Figure 8:
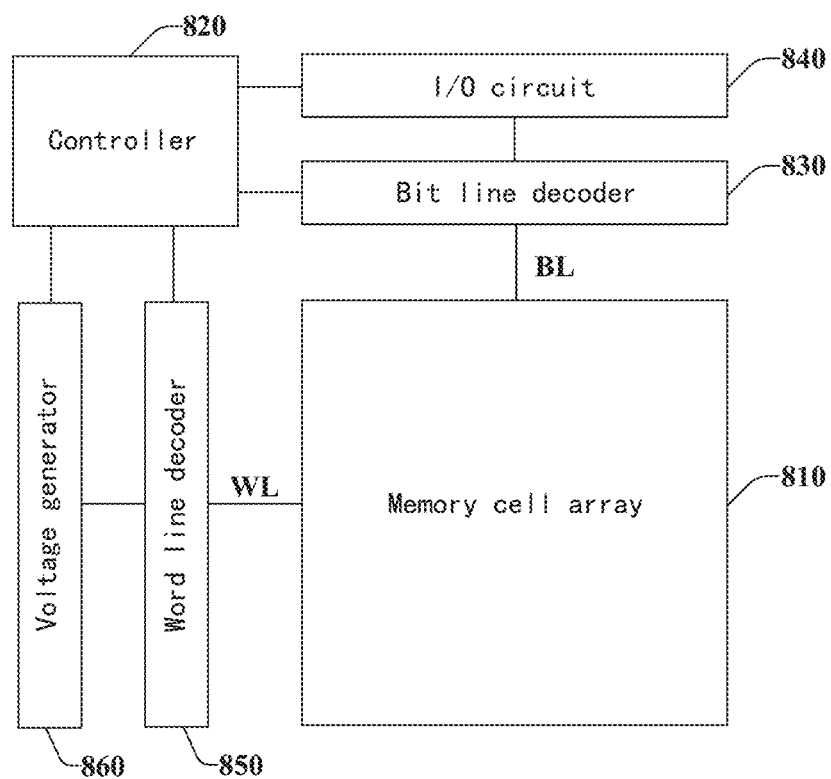
FIG. 8 is a module diagram of a three-dimensional memory according to an embodiment of the present disclosure.

FIG. 8 is a module diagram of a three-dimensional memory according to an embodiment of the present disclosure. The foregoing control method of the three-dimensional memory of the present disclosure may be used to control the three-dimensional memory of the embodiment, and thus, the foregoing drawings and description all may be used to describe the three-dimensional memory of the present disclosure.

Referring to FIG. 8, the three-dimensional memory comprises a memory cell array 810 and a controller 820. The memory cell array 810 comprises a plurality of memory strings each extending vertically above a substrate and comprising a plurality of memory cells that are arranged vertically in series connection. The plurality of memory cells include a first portion and a second portion, and the diameter of the channel structure of the first portion of memory cells is smaller than that of the channel structure of the second portion of memory cells. The controller 820 is configured to apply a pass voltage Vpass to non-selected memory cells when a read operation is performed for the selected memory cells, wherein a first pass voltage Vpass1 is applied to first non-selected memory cells in the first portion, and a second pass voltage Vpass2 is applied to second non-selected memory cells in the second portion, and wherein the first pass voltage Vpass 1 is lower than the second pass voltage Vpass2.

In some embodiments, the controller 820 is further configured to apply the second pass voltage Vpass2 to the second non-selected memory cells when a program verify operation is performed for the selected memory cells, apply the first pass voltage Vpass1 to the first non-selected memory cells if the first non-selected memory cells are in a program state, and apply the second pass voltage Vpass2 to the first non-selected memory cells if the first non-selected memory cells are in an erase state.

The controller 820 may implement the above functions using the control method of the three-dimensional memory of the present disclosure, and thus, the foregoing drawings and description can be used to describe the specific functions of the controller 820 of the three-dimensional memory of the present disclosure. The same contents will not be described any longer.

In the embodiment, each memory cell included in the memory cell array 810 may be a single-level cell SLC storing 1-bit data therein, or a multi-level cell (MLC) capable of storing 2-bit or more-bit data therein, such as MLC, TLC, and QLC, etc., or any combination of the single-level cell and the multi-level cell.

In the embodiment, the memory cells in the memory cell array 810 may be connected to word lines WL and bit lines BL. Meanwhile, the memory cell array 810 may be also connected to other select lines, such as string select lines SSL, ground select lines GSL, etc. Specifically, the memory cell array 810 may be connected to a word line decoder 850 through the word lines WL or the select lines (SSL and/or GSL), and further connected to a voltage generator 860. The memory cell array 810 may be connected to a bit line decoder 830 through the bit lines BL, and further connected to an input/output (I/O) circuit 840. The controller 820 is connected with the bit line decoder 830, the I/O circuit 840, the word line decoder 850 and the voltage generator 860, respectively.

When an erase, program, read-write or verify operation is required to be performed for one or more memory cells, the controller 820 may transmit addresses of the one or more memory cells to the bit line decoder 830 and the word line decoder 850 for addressing by the bit line decoder 830 through the bit line BL, and for addressing by the word line decoder 850 through the word line WL.

In some embodiments, the functions of the bit line decoder 830 and the word line decoder 850 may be implemented by a unified address decoder. The address decoder may further comprise components, such as an address buffer, etc.

The I/O circuit 840 may receive data from the controller 820 and/or outside and store the received data in the memory cell array 810 for write operation on the one hand, and may read data from the memory cell array 810 and output the read data to the controller 820 and/or the outside for read operation on the other hand.

The voltage generator 860 may generate various voltages for performing the erase, program, read-write and verify operations for the memory cell array 810 in response to a control signal from the controller 820. Particularly, the voltage generator 860 may generate a word line voltage, for example, a program voltage (or a write voltage), a program suppression voltage, a read voltage, and a verify voltage, etc. The voltage generator 860 may generate a bit line voltage, such as a bit line force voltage or inhibition voltage. In the embodiment of the present disclosure, the voltage generator 860 may generate the foregoing pass voltage Vpass (which comprises a first pass voltage Vpass1 and a second pass voltage Vpass2), a read voltage Vread and a program verify voltage Vverify, etc.

The controller 820 may output a control signal to the bit line decoder 830, the I/O circuit 840, the word line decoder 850 and the voltage generator 860. For example, the controller 820 may output a voltage control signal to the voltage generator 860, output a word line address to the word line decoder 850, output a bit line address to the bit line decoder 830, output write data to the I/O circuit 840, and receive data read from the I/O circuit 840.

In some embodiments, the controller 820 controls the bit line decoder 830 to select some bit lines BL, controls the word line decoder 850 to select some word lines WL, and applies a certain voltage to these bit lines BL and word lines WL through the voltage generator 860. For example, during a read operation, a read voltage may be applied to the selected word lines WL, and for the memory cells inhibited for read, a read inhibition voltage is applied to the non-selected bit lines BL. During a program operation, a program voltage and a verify voltage may be applied to the selected word lines WL, and a program inhibition voltage is applied to the non-selected bit lines BL.

The controller 820 of the embodiment of the present disclosure may further comprise components, such as a processor, an I/O interface, etc. A control logic of the controller 820 for the bit line decoder 830, the I/O circuit 840, the word line decoder 850 and the voltage generator 860 is not limited to the above. The controller 820 may also implement any other logic control functions for nonvolatile memories, which can be understood by those skilled in the art.

In some embodiments, the controller 820 can indicate, based on software, the required memory operations to be performed by the memory cell array 810.

In the embodiments of the present disclosure, the memory strings extend vertically above the substrate. The substrate may be a silicon substrate (Si), a germanium substrate (Ge), a silicon germanide substrate (SiGe), Silicon on Insulator (SOD, or Germanium on Insulator (GOI), etc. In some embodiments, the substrate may also be a substrate comprising other elemental semiconductors or compound semiconductors, such as GaAs, InP, or SiC, etc. It may also be a stack structure, such as Si/SiGe, etc. It may further comprise other epitaxial structure, such as SiGe on Insulator (SGOI), etc. In some embodiments, the substrate can be made from an electrically non-conductive material, such as a glass, a plastic, or a sapphire wafer, etc. Some necessary processes may have been performed on the substrate, for example, a common active area has been formed and the necessary cleaning has been carried out, etc.

A stack structure is disposed above the substrate, and may be a stack formed by alternate lamination of first material layer and second material layer. The first material layer and the second material layer may be selected from following materials and comprise at least one insulating dielectric, for example, silicon nitride, silicon oxide, amorphous carbon, diamond-like amorphous carbon, germanium oxide, aluminum oxide, etc., and a combination thereof. The first material layer and the second material layer have different etching selectivities. For example, they may be a combination of silicon nitride and silicon oxide, a combination of silicon oxide and undoped polysilicon or amorphous silicon, a combination of silicon oxide or silicon nitride and amorphous carbon, etc. A deposition method of the first material layer and the second material layer of the stack structure may include chemical vapor deposition (CVD, PECVD, LPCVD and HDPCVD), atomic layer deposition (ALD), or physical vapor deposition methods, such as molecular beam epitaxy (MBE), thermal oxidation, evaporation, sputtering, and other various methods. In the embodiment of the present disclosure, the first material layer may be gate layer, and the second material layer may be dielectric layer. The gate layer may be formed after removal of dummy gate layer. A material of a gate sacrificial layer may be, for example, a silicon nitride layer. A material of the gate layer may be a conductive material, such as metal tungsten, cobalt, copper, nickel, etc., or may be polysilicon, doped silicon, or any combination thereof. A material of the dielectric layer may be, for example, silicon oxide, aluminum oxide, hafnium oxide, tantalum oxide, etc.

In the embodiment of the present disclosure, a material of the substrate may be, for example, silicon. The first material layer and the second material layer are, for example, a combination of silicon nitride and silicon oxide. Taking the combination of silicon nitride and silicon oxide as an example, silicon nitride and silicon oxide may be alternately deposited on the substrate in sequence to form the stack structure by chemical vapor deposition (CVD), atomic layer deposition (ALD) or other appropriate deposition methods.

Although an exemplary composition of an initial semiconductor structure is described herein, it is understood that, one or more features may be removed from, replaced, or added to such semiconductor structure. For example, various well regions may be formed in the substrate as required. Furthermore, the exemplified materials of the respective layers are merely exemplary, for example, the substrate may also be other silicon-containing substrates, such as SOI (Silicon on Insulator), SiGe, Si:C, etc. The gate layer may also be other conductive layer, for example, metal tungsten, cobalt, nickel, etc. The second material layer may also be other dielectric materials, such as aluminum oxide, hafnium oxide, tantalum oxide, etc.

The channel structure corresponding to the memory cell may be formed in the channel hole vertically through the stack structure. Thus, the channel structure may be cylindrical. The channel structure may comprise a channel layer and a memory layer. As a whole, the memory layer and the channel layer are disposed in sequence from the outside to the inside in a radial direction of the channel structure. The memory layer may comprise a blocking layer, a charge trapping layer and a tunneling layer that are disposed in sequence from the outside to the inside in the radial direction of the channel structure. A filling layer may be also disposed in the channel layer. The filling layer may function as a support. The material of the filling layer may be silicon oxide. The filling layer may be solid, or hollow on the premise of no influence on the device reliability. The formation of the channel structure may be implemented by one or more film deposition processes, for example, ALD, CVD, PVD, etc., or any combination thereof.

In some embodiments, the three-dimensional memory of the present disclosure further comprises a plurality of word lines, each of which is coupled with a page of memory cells at the same cell depth, wherein each memory cell is located at a corresponding cell depth in the memory string.

Figure 9:
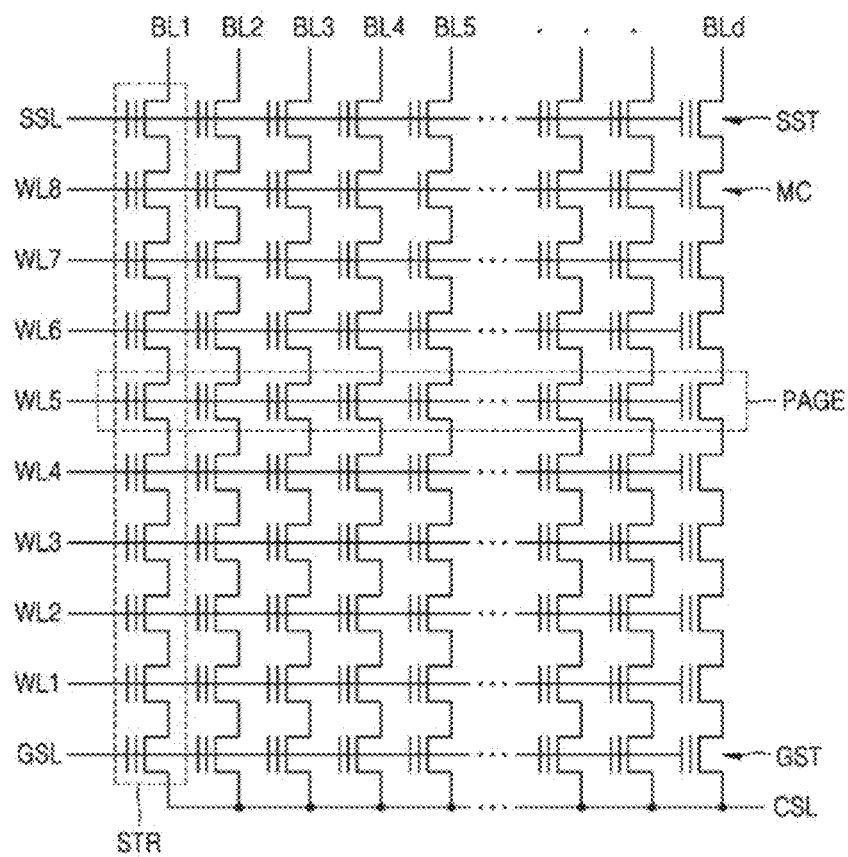
FIG. 9 is a circuit schematic diagram of a memory block capable of being used for the embodiments of the present disclosure.

FIG. 9 is a circuit schematic diagram of a memory block capable of being used for the embodiments of the present disclosure. The memory cell array 810 as shown in FIG. 8 may comprise a plurality of memory blocks. Referring to FIG. 9, MC (Memory Cell) represents a memory cell, and each memory cell has a corresponding cell depth. For example, the memory cell MC in FIG. 9 is located at a gate layer coupled with the word line WL8. The memory string STR connects the plurality of memory cells in series in a direction where the number of the word line layers WL1-WL8 gradually increases. The memory cells at the same cell depth are located in the same page. The controller 820 controls the voltage generator 860 to generate a voltage which is applied to the respective word lines according to settings, thereby controlling the voltage applied to each memory cell.

Each string STR may further comprise string select transistor SST and ground select transistor GST which are connected to both ends of the memory cells MC connected in series, respectively. CSL denotes a common source line. The numbers of the memory strings STR, the word lines WL and the bit lines BL may vary according to the embodiment.

FIG. 9 merely shows an example, and does not limit the practical structure and the number of the word line layers, etc. of the three-dimensional memory of the present disclosure.

In some embodiments, the diameter of the channel structure of the memory strings of the present disclosure gradually increases from the bottom to the top of the memory strings.

In some embodiments, the first portion of memory cells is located below the second portion of memory cells.

In some embodiments, the memory strings comprise first memory string and second memory string which are stacked in an extension direction of the channel structure, the diameter of the channel structure of the first memory string gradually increasing from the bottom to the top of the first memory string, and the diameter of the channel structure of the second memory string gradually increasing from the bottom to the top of the second memory string. The diameter of the channel structure at the top of the first memory string may be larger than that of the channel structure at the bottom of the second memory string. The structure of the three-dimensional memory of these embodiments may be referred to FIG. 1, and the three-dimensional memory comprises more than 2 decks each comprising a channel structure of which the diameter is small at the bottom and large at the top.

In some embodiments, the three-dimensional memory of the present disclosure is a 3D NAND flash.

For the three-dimensional memory of the present disclosure, during the read operation, a relatively low first pass voltage is applied to the memory cells with small-aperture channel structure, which can effectively reduce read disturb of this portion of memory cells; moreover, at a program verify stage, the relatively low first pass voltage is also applied to the memory cells with small-aperture channel structure, thereby further reducing the read disturb of this portion of memory cells and improving the reliability of the three-dimensional memory.

Notwithstanding the present disclosure is described by reference to the current specific embodiments, those skilled in the art have to learn that, the above embodiments are merely used for illustrating the present disclosure, and various equivalent modifications or replacements may also be made without departing from the spirit of the present disclosure. Thus, as long as the variations and variants of the above embodiments are within the substantial spirit of the present disclosure, they will are within the scope of the claims of the present application.

What is claimed is:

1. A control method of a three-dimensional memory, the three-dimensional memory comprising a first deck and a second deck that are stacked in a vertical direction of a substrate, the first deck and the second deck each comprising a plurality of memory strings, each memory string comprising a plurality of memory cells, the plurality of memory cells comprising a first portion and a second portion, wherein a diameter of a channel structure corresponding to the first portion of memory cells is smaller than that of the channel structure corresponding to the second portion of memory cells, the method comprising:

performing a read operation for selected memory cells which are in at least one of the first deck or the second deck; and applying a pass voltage to non-selected memory cells other than the selected memory cells in the first deck and the second deck, the pass voltage comprising a first pass voltage and a second pass voltage, the first pass voltage being lower than the second pass voltage, wherein the first pass voltage is applied to first non-selected memory cells in the first portion, and the second pass voltage is applied to second non-selected memory cells in the second portion.

2. The control method of claim 1, further comprising:

performing a program verify operation for the selected memory cells; and applying the pass voltage to non-selected memory cells other than the selected memory cells in the first deck and the second deck, wherein the second pass voltage is applied to the second non-selected memory cells, and the pass voltage to be applied is determined according to states of the first non-selected memory cells, if the first non-selected memory cells are in a program state, the first pass voltage is applied to the first non-selected memory cells; and if the first non-selected memory cells are in an erase state, the second pass voltage is applied to the first non-selected memory cells.

3. The control method of claim 1, wherein the memory cells in the memory strings are coupled to corresponding word lines through which the pass voltage is applied to the memory cells.

4. The control method of claim 3, wherein a read voltage is applied to word lines of the selected memory cells when the read operation is performed for the selected memory cells.

5. The control method of claim 3, wherein a program verify voltage is applied to the word lines of the selected memory cells when a program verify operation is performed for the selected memory cells.

6. The control method of claim 3, wherein each memory cell is located at a corresponding cell depth in the memory strings, and a program operation is performed for a page of the memory cells located at a same cell depth through the word line layer by layer in an extension direction of channel structure of the memory strings.

7. A three-dimensional memory, comprising:
a memory cell array comprising a first deck and a second deck that are stacked in a vertical direction of a substrate, the first deck and the second deck each comprising a plurality of memory strings, each memory string extending vertically above the substrate and comprising a plurality of memory cells that are arranged vertically in series connection;
the plurality of memory cells comprising a first portion and a second portion, a diameter of a channel structure of the first portion of memory cells being smaller than that of the channel structure of the second portion of memory cells; and
a controller configured to transmit a control signal to a voltage controller when a read operation is performed for selected memory cells, the voltage controller applying a pass voltage comprising a first pass voltage and a second pass voltage to non-selected memory cells in response to the control signal, the first pass voltage being lower than the second pass voltage, wherein the first pass voltage is applied to first non-selected memory cells in the first portion, and the second pass voltage is applied to second non-selected memory cells in the second portion.

8. The three-dimensional memory of claim 7, wherein the controller is further configured to transmit a control signal to the voltage controller when a program verify operation is performed for selected memory cells, the voltage controller applying the second pass voltage to the second non-selected memory cells in response to the control signal, applying the first pass voltage to the first non-selected memory cells if the first non-selected memory cells are in a program state; and applying the second pass voltage to the first non-selected memory cells if the first non-selected memory cells are in an erase state.

9. The three-dimensional memory of claim 7, further comprising a plurality of word lines, each of which is coupled with a page of memory cells at a same cell depth, wherein each memory cell is located at a corresponding cell depth in the memory strings.

10. The three-dimensional memory of claim 7, wherein the diameter of the channel structure of the memory strings gradually increases from bottom to top of the memory strings.

11. The three-dimensional memory of claim 7, wherein the first portion of memory cells is located below the second portion of memory cells.

12. The three-dimensional memory of claim 7, wherein the memory strings comprise first memory string and second memory string which are stacked in an extension direction of the channel structure, the diameter of the channel structure of the first memory string gradually increasing from bottom to top of the first memory string, and the diameter of the channel structure of the second memory string gradually increasing from bottom to top of the second memory string.

13. The three-dimensional memory of claim 12, wherein the diameter of the channel structure at the top of the first memory string is larger than that of the channel structure at the bottom of the second memory string.

14. The three-dimensional memory of claim 7, wherein the three-dimensional memory is a 3D NAND flash.

* * * * *